(12) United States Patent
Vacanti

(10) Patent No.: US 8,866,667 B2
(45) Date of Patent: Oct. 21, 2014

(54) HIGH SENSITIVITY SINGLE ANTENNA FMCW RADAR

(71) Applicant: Honeywell International Inc., Morristown, NJ (US)

(72) Inventor: David C. Vacanti, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 180 days.

(21) Appl. No.: 13/662,755

(22) Filed: Oct. 29, 2012

(65) Prior Publication Data

US 2013/0214963 A1    Aug. 22, 2013

Related U.S. Application Data

(60) Provisional application No. 61/601,717, filed on Feb. 22, 2012.

(51) Int. Cl.
*G01S 13/08* (2006.01)
*H03L 7/197* (2006.01)
*G01S 13/88* (2006.01)

(52) U.S. Cl.
CPC ............. *G01S 13/882* (2013.01); *H03L 7/1974* (2013.01)
USPC ........... 342/120; 342/122; 342/128; 342/100; 342/103; 342/198

(58) Field of Classification Search
CPC ..... G01S 13/882; G01S 13/32; G01S 13/343; H03L 7/23; H03L 2207/06; H03L 2207/12; H03L 7/06; H03L 7/197; H03L 7/1974; H03B 21/02
USPC ............ 342/120–122, 128, 99–103, 175, 198
See application file for complete search history.

(56) References Cited

U.S. PATENT DOCUMENTS 4,577,163 A    3/1986  Culp
4,695,013 A    9/1987  Trampnau (Continued)

FOREIGN PATENT DOCUMENTS

DE    19855367 A1 *  6/2000  ................ H03L 7/00
EP    1227536         7/2002

(Continued)

OTHER PUBLICATIONS

Benard, David J., "A High-Stability Low-Offset Phase-Locked-Loop Frequency Synthesizer," Instrumentation and Measurement, IEEE Transactions on , vol. 24, No. 3, pp. 222,224, Sep. 1975.*

(Continued)

*Primary Examiner* — John B Sotomayor
(74) *Attorney, Agent, or Firm* — Fogg & Powers LLC

(57) ABSTRACT

One embodiment is directed towards a FMCW radar having a single antenna. The radar includes a transmit path having a voltage controlled oscillator controlled by a phase-locked loop, and the phase-locked loop includes a fractional-n synthesizer configured to implement a FMCW ramp waveform that ramps from a starting frequency to an ending frequency and upon reaching the ending frequency returns to the starting frequency to ramp again. The radar also includes a delay path coupled between a coupler on the transmit path and a mixer in a receive path. The delay path is configured to delay a local oscillator reference signal from the transmit path such that the propagation time of the local oscillator reference signal from the coupler to the mixer through the delay path is between the propagation time of signal reflected off the antenna and the propagation time of a leakage signal through a circulator.

20 Claims, 4 Drawing Sheets

(56) References Cited

U.S. PATENT DOCUMENTS

| | | | |
|---|---|---|---|
| 4,825,214 A | | 4/1989 | Dejaegher |
| 4,945,360 A | * | 7/1990 | Trummer et al. ............ 342/122 |
| 4,965,533 A | | 10/1990 | Gilmore |
| 4,967,201 A | | 10/1990 | Rich, III |
| 4,968,967 A | | 11/1990 | Stove |
| 5,353,038 A | | 10/1994 | Osborne et al. |
| 5,548,243 A | | 8/1996 | Sun et al. |
| 5,719,581 A | | 2/1998 | Poe |
| 5,757,239 A | | 5/1998 | Gilmore |
| 5,757,311 A | | 5/1998 | Voyce |
| 6,043,758 A | | 3/2000 | Snyder, Jr. et al. |
| 6,087,980 A | | 7/2000 | Saryo |
| 6,154,640 A | | 11/2000 | Itoh et al. |
| 6,295,020 B1 | * | 9/2001 | Koechlin ..................... 342/175 |
| 6,373,427 B1 | | 4/2002 | Hohne |
| 6,384,770 B1 | | 5/2002 | de Gouy et al. |
| 6,407,697 B1 | | 6/2002 | Hager et al. |
| 6,426,717 B1 | | 7/2002 | Maloratsky |
| 6,486,826 B1 | | 11/2002 | Cramer et al. |
| 7,239,266 B2 | | 7/2007 | Vacanti |
| 7,463,710 B2 | | 12/2008 | Walsh et al. |
| 7,791,415 B2 | | 9/2010 | Hornbuckle |
| 8,085,097 B2 | | 12/2011 | Cloutier et al. |
| 8,638,139 B2 | * | 1/2014 | Keaveney et al. ............ 327/156 |
| 2002/0066829 A1 | | 6/2002 | DeWitt et al. |
| 2003/0201930 A1 | | 10/2003 | Nagasaku et al. |
| 2004/0130482 A1 | | 7/2004 | Lin et al. |
| 2004/0135703 A1 | | 7/2004 | Arnold et al. |
| 2006/0049977 A1 | | 3/2006 | Vacanti |
| 2008/0246649 A1 | | 10/2008 | Backes et al. |
| 2010/0225524 A1 | | 9/2010 | Szajnowski |
| 2010/0283665 A1 | | 11/2010 | Bashir et al. |
| 2011/0122017 A1 | | 5/2011 | Vacanti |
| 2011/0205105 A1 | * | 8/2011 | Reuter ......................... 342/200 |
| 2012/0112806 A1 | * | 5/2012 | Dayi ............................ 327/145 |
| 2012/0242383 A1 | * | 9/2012 | Elad et al. .................... 327/156 |
| 2013/0033402 A1 | | 2/2013 | Meyer |
| 2013/0214963 A1 | * | 8/2013 | Vacanti ........................ 342/120 |
| 2013/0214964 A1 | | 8/2013 | Holt |
| 2014/0028491 A1 | | 1/2014 | Ferguson |
| 2014/0070985 A1 | * | 3/2014 | Vacanti ......................... 342/201 |

FOREIGN PATENT DOCUMENTS

| | | | | |
|---|---|---|---|---|
| JP | 60008197 | | 1/1985 | |
| JP | 6120735 | | 4/1994 | |
| JP | 06120735 | | 4/1994 | |
| JP | 897744 | | 4/1996 | |
| JP | 08125701 | | 5/1996 | |
| JP | 11148972 | | 6/1999 | |
| JP | 2002353709 | | 12/2002 | |
| JP | 2003018001 | | 1/2003 | |
| JP | 2005151444 A | * | 6/2005 | ............... H03L 7/18 |
| JP | 2013200135 A | * | 10/2013 | |
| WO | 2011064157 | | 6/2011 | |

OTHER PUBLICATIONS

Bisanti, B.; Cipriani, S.; Carpineto, L.; Coppola, F.; Duvivier, E.; Mouralis, N.; Ercole, D.; Puccio, G.; Roussel, V.; Cercelaru, S., "Fully integrated sigma-delta synthesizer suitable for "indirect VCO modulation" in 2.5G application," Radio Frequency Integrated Circuits (RFIC) Symposium, 2003 IEEE , vol., No., pp. 515,518, Jun. 8-10, 2003.*

Reynolds et al., "Single chip FMCW radar for target velocity and range sensing applications", "Gallium Arsenide Integrated Circuit (GaAs IC) Symposium, 1989. Technical Digest 1989., 11th Annual", Oct. 1989, pp. 243-246.

Ferguson, "Method of System Compensation to Reduce the Effects of Self Interference in Frequency Modulated Continuous Wave Altimeter Systems", U.S. Appl. No. 13/559,834, filed Jul. 27, 2012.

European Patent Office, "European Search Report", from Foreign Counterpart of U.S. Appl. No. 13/662,755, Jun. 7, 2013, pp. 1-3, Published in: EP.

European Patent Office, "European Search Report", from Foreign Counterpart of U.S. Appl. No. 13/760,347, Jun. 6, 2013, pp. 1-3, Published in: EP.

Japan Patent Office, "Notification of Reasons for Rejection", from Foreign Counterpart of U.S. Appl. No. 10/926,676, Apr. 25, 2011, pp. 1-8, Published in: JP.

Japan Patent Office, "Notice of Reason for Rejection", from Foreign Counterpart of U.S. Appl. No. 10/926,676, Jul. 9, 2012, pp. 1-6, Published in: JP.

U.S. Patent and Trademark Office, "Notice of Allowance", U.S. Appl. No. 10/926,676, Mar. 14, 2007, pp. 1-6.

U.S. Patent and Trademark Office, "Office Action", U.S. Appl. No. 10/926,676, Apr. 17, 2006, pp. 1-10.

U.S. Patent and Trademark Office, "Final Office Action", U.S. Appl. No. 10/926,676, Sep. 8, 2006, pp. 1-9.

Appel, "Fractional N Synthesizers", "RF Signal Processing", Nov. 2000, pp. 1-9.

Gaglio et al., "An Integrated GaAs 1.25 GHz Clock Frequency FM-CW Direct Digital Synthesizer", Oct. 1993, pp. 167-170.

Jeong et al., "A Multi-Beam and Multi-Range Radar with FMCW and Digital Beam Forming for Automotive Applications", "Progress in Electromagnetics Research", Nov. 2011, pp. 285-299, vol. 124.

Nash, "Phase-Locked Loop Design Fundamentals", Feb. 2006, pp. 1-22, Publisher: Freescale Semiconductor.

Pazarci, "Phase-Lock Systems (ELE608E-01)", Jan. 27, 2009, pp. 1-2.

Saul, "Direct Frequency Synthesis: A Review of the Technique and Potential", Jul. 1990, pp. 5-9, Publisher: Plessey Research Caswell, U.K.

"Fractional/Integer-N PLL Basics", Aug. 1999, pp. 1-55, Publisher: Texas Instruments.

Japanese Patent Office, "Office Action", from Foreign Counterpart of U.S. Appl. No. 10/926,676, Aug. 2, 2013, pp. 1-9, Published in: JP.

European Patent Office, "Office Action", from Foreign Counterpart of U.S. Appl. No. 13/760,347, Jun. 19, 2013, pp. 1-6, Published in: EP.

"KRA 10A Radar Altimeter", May 2000, pp. 1-4, Publisher: Allied Signal Aerospace.

"TRA-3000 and TRA-3500 Radar Altimeters", Feb. 2009, pp. 1-2, Publisher: Free Flight Systems.

"Honeywell HG8500 Series Radar Altimeter", Jul. 2003, pp. 1-2, Publisher: Honeywell International Inc.

"Miniature Radar Altimeter: MRA Type 1", May 2012, pp. 1-2, Publisher: Roke Manor Research Limited.

"Miniature Radar Altimeter: MRA Type 2", May 2012, pp. 1-2, Publisher: Roke Manor Research Limited.

"Micro Radar Altimeter: UMRR-OA", Dec. 2011, pp. 1-2, Publisher: S.M.S. Smart Microwave Sensors GmbH.

"Radar Altimeter System Comparison", Dec. 2011, p. 1, Publisher: Southeast Aerospace.

* cited by examiner

HIGH SENSITIVITY SINGLE ANTENNA FMCW RADAR

This application claims the benefit of U.S. Provisional Application No. 61/601,717, filed on Feb. 22, 2012, which is incorporated herein by reference in its entirety.

BACKGROUND

A frequency modulated continuous wave (FMCW) radar can be designed to transmit and receive from the same antenna, or to transmit and receive from separate antennas. Using separate antennas for transmitting and receiving provides improved isolation between the transmit and receive path at the expense of increased size to accommodate each of the antennas and provide spacing between the antennas. In order to reduce the size, radars can be designed to transmit and receive from a single antenna. Using a single antenna, however, decreases the isolation between the transmit and receive path resulting in increased coupling of signals from the transmit path into the receive path. These signals from the transmit path appear as noise in the receive path and reduce the sensitivity of the receiver. If enough signal from the transmit path is coupled into the receive path, the transmit signal can drown out the receive signal entirely. In high precision radar applications, such as in radar altimeters for aircraft, radar sensitivity can be crucial.

The frequency range in which a radar operates also has an effect on the performance of the radar. The frequency range used by a radar can be based on available spectrum as well as the distance that the radar will be measuring. For example, aircraft radar altimeters can be required to measure a wide range of distance, from 15,000 ft down to 5 ft. Also, commercial radar altimeters are currently required to operate between 4.2-4.4 GHz.

SUMMARY

One embodiment is directed towards a frequency modulated continuous wave (FMCW) radar having a single antenna. The radar includes a transmit path coupled to the single antenna and configured to provide a FMCW signal thereto. The transmit path includes a voltage controlled oscillator controlled by a phase-locked loop, and the phase-locked loop includes a fractional-n synthesizer integrated circuit (IC) configured to implement a FMCW ramp waveform that ramps from a starting frequency to an ending frequency and upon reaching the ending frequency returns to the starting frequency to ramp again. The radar also includes a receive path coupled to the single antenna and configured to include a reflected version of the FMCW signal as a reflected signal and a portion of the FMCW signal leaking through a circulator as a leakage signal. The receive path includes components configured to filter and sample a signal in the receive path. The radar also includes a delay path coupled between a coupler on the transmit path and a mixer in the receive path. The delay path includes a delay element configured to delay a local oscillator reference signal from the transmit path such that the propagation time of the local oscillator reference signal from the coupler to the mixer through the delay path is between the propagation time of the reflected signal and the propagation time of the leakage signal, wherein the mixer is configured to subtract the local oscillator reference signal from the signal in the receive path.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
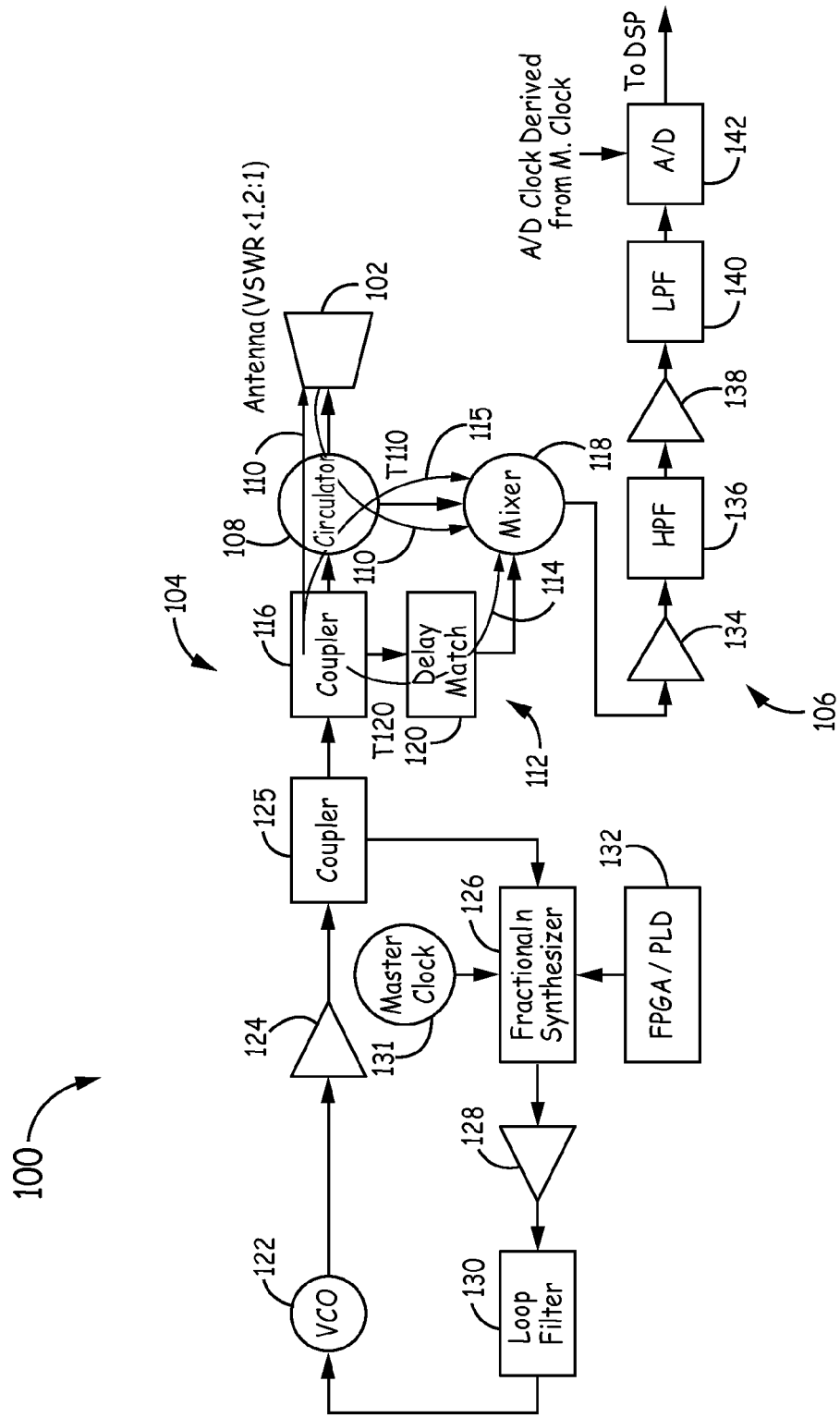
FIG. 1 is a block diagram of an example FMCW radar.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

FIG. 1 is a block diagram of an example FMCW radar 100. The FMCW radar 100 can transmit and receive from a single antenna 102 with high sensitivity. A circulator 108 couples a transmit path 104 and a receive path 106 to the antenna 102 and provides some isolation of the receive path 106 from the transmit path 104. In an example, the circulator 108 is a conventional circulator commercially available and provides at least 20 dB of isolation from the output of the coupler 116 (from the transmit path 104) to the input of the receiver mixer 118 (toward the receive path 106).

Although the circulator 108 provides isolation for signals from the transmit path 104 leaking directly into the receive path 106, the circulator 108 does not protect against signals from the transmit path 104 that are reflected off of the single antenna 102. This reflected signal 110 is received at the port of the circulator 108 that is coupled to the antenna 102. The signal received by the antenna (also referred to herein as "the received signal") is also received at this port of the circulator 108. The circulator 108 allows both the reflected signal 110 and the received signal to pass through to the receive path 106.

The phase noise from this reflected signal 110 can increase the noise in the receive path 106. Accordingly, this reflected signal 110 is a concern for the FMCW radar 100 because large amplitude reflections 110 can cause the continuously transmitting FMCW signal to jam the receiver, thereby limiting sensitivity. To address these reflections 110, the antenna 102 has a low reflection level from the transmit path 104 (at least 20 dB below the incident level), a transmitter power level (e.g., amplifier 124) that is less than 23 dBm, and low phase noise from the transmitter (better than −120 dBc/Hz at 100 KHz offset). The magnitude of the reflection from the antenna 102 is less than or equal to the isolation level of the circulator 108. The magnitude of the reflection from the antenna 102 is known by two terms voltage standing wave ratio (VSWR) and return loss. If the circulator 108 has 20 dB of isolation, than the return loss should be 20 dB or greater. Thus, the reflected power level will be at least 20 dB below the incident power level. In an example, the VSWR of the antenna 102 is less than 1.2 to 1.

The transmitter power level, that is, the power level of the amplifier 124, is controlled such that the power level of the FMCW signal in the transmit path 104 is less than 23 dBm. Signals in the transmit path 104 having too high of power may cause too much power to reach the mixer 118 in the receive path 106 due to the limited isolation of the circulator 108 and the reflection level from a realizable antenna 102 (return loss of greater than 20 dB, VSWR<1.2:1). The FMCW radar 100 also addresses the phase noise of the transmitter as discussed in more detail below.

Phase noise in the received signal can also be obtained from a leakage signal 115 due to the limited isolation of the circulator 108 between the transmit path 104 and the receive path 106. The leakage signal 115 leaks through the circulator 108 from the transmit path 104 into the receive path 106. Because the leakage signal 115 may be of the same order of magnitude as the reflected signal 110, the phase noise of the transmitter contributed by the leakage path would also cause severe reduction in sensitivity of the receiver.

The noise from the reflected signal 110 and the leakage signal 115 in the FMCW radar 100 can also be limited by using a delay match path 112. The delay match path 112 uses a reference signal (also referred to herein as the "local oscillator reference signal 114") to cancel transmitter phase noise from the reflected signal 100 and the leakage signal 115 that would otherwise be converted into noise in the receive path 106 and reduce sensitivity. The local oscillator reference signal 114 is a portion of the signal from the transmit path 104 that is coupled into the delay match path 112 by a coupler 116. This local oscillator reference signal 114 is provided to a mixer 118 along with the signals arriving from the antenna 102. The mixer 118 effectively subtracts the local oscillator reference signal 114 from the signals arriving form the antenna 102. In order to cancel the phase noise from the reflected signal 110 and the leakage signal 115, the propagation time (T120) of the local oscillator reference signal 114 from the coupler 116 to the mixer 118 through the delay path 112 is set based on the propagation time (T110) of the reflected signal 110 from the coupler 116 off of the antenna 102 and to the mixer 118. The propagation time (T110) of the reflected signal 110 is based on the distance from the coupler 116 to the antenna 102 and from the antenna 102 to the mixer 118. Thus, the propagation time (T110) is based on the physical length of the path of the electrical signal through the corresponding elements and connecting transmission lines of the FMCW radar 100.

In addition, the propagation time (T110) of the reflected signal 110 is also based on the propagation speed of the signals as they are reflected from the antenna 102. In an example, the antenna 102 is selected to have desirable group delay characteristics. Group delay refers to the propagation speed of signals at different frequencies as those signals reflect off of the antenna 102. In particular, many antennas have different propagation speeds for signals of different frequencies. In such antennas having differing propagation speeds, it may be more difficult to cancel out the reflected signal 110, since different frequencies within the reflected signal 110 are in different alignment from where they were in the transmit path 104. Moreover, many of the antennas have a non-linear relationship between propagation speed and frequency, adding to the difficulty of cancellation. Essentially large variations in group delay of the antenna 110 are observed as large variations in the delay time of the reflected signal 110. If these large variations were present the delay path would provide cancellation in the mixer 118 for the portion of the time when the group delay affected reflected signal 110 remained constant. Where it deviated (became shorter or longer) the cancellation effectiveness is degraded. Thus, even if the delay path 112 is provided it is difficult to deal with large variation in group delay. In order to aid in the cancellation of phase noise from the reflected signal 110, the antenna 102 is selected to have a sufficiently flat group delay over the frequencies in the reflected signals 110, typically on the order of +/−1 nSec. In an example, the antenna has a substantially flat group delay over the entire swept bandwidth of the transmitted FMCW signal.

In an example, the propagation time (T120) of the delay match path 114 is set to be between the propagation time (T110) of the reflected signal 110 and the propagation time of the leakage signal 115. In particular, within the range between the propagation time (T110) of the reflected signal 110 and the propagation time of the leakage signal 115, the propagation time (T120) of the delay match path 114 can be set closer to the propagation time of the signal (reflected or leakage) that is stronger in the receive path 106. The stronger one of the signals (reflected or leakage) is relative to the other can determine how close the propagation time (T120) of the delay match path 114 is set to the propagation time of that signal.

In order to set the propagation time (T120) of the local oscillator reference signal 114, the delay match path 112 includes a delay element 120 to provide a set delay to the local oscillator reference signal 114. The mixer 118 is configured to combine the local oscillator reference signal 114 with the signal from the circulator 108 (which includes the reflected signal 110). In an example the delay element 120 comprises a propagation path having a length that is substantially equal to the set delay in seconds multiplied by the propagation speed of the local oscillator reference signal 114. Accordingly, the set delay can be configured by adjusting the length of the propagation path of the delay path 112. In an example, the delay element 120 can be configured such that the distance of the delay match path 112 is within 0.05 meters of the distance from the coupler 116 to the antenna 102 and then to the mixer 116. As the difference in length between the two paths decreases the phase noise cancellation increases.

In an example, the coupler 116 is a hybrid coupler such that a signal reflected from the circulator 108 is terminated in a load. The physical length of the electrical path for the leakage signal 115 is shorter than for the reflected signal 110. Thus, the electrical length of the reflected signal 110 is kept short (e.g., as short as possible) in order to reduce the difference between the length of the leakage signal 115 and the length of the reflective signal 110. To reduce the length of the reflected signal 110, the antenna 102 is connected closely (e.g., as closely as physically possible) to the circulator 108. In particular, the antenna 102 cannot be remotely located from the circulator 108 or the overall benefit of the system (increased sensitivity) will be impaired. In an example, the antenna 102 is composed of one or more resonant elements and is within 1 to 2 cm of the circulator 108. The closer the antenna 102 is to the coupler 116, the less delay that is needed by the delay element 120.

The transmit path 104 of the FMCW radar 100 generates a FMCW linear ramp signal to be propagated from the radar 100. The FMCW linear signal can ramp (e.g., an increasing ramp) in frequency over time from a starting frequency to an ending frequency. Upon reaching the ending frequency, the FMCW linear signal can return to the starting frequency in order to repeat the ramp. In some examples the return to the starting frequency can be a ramp (e.g., a decreasing ramp) at the same rate as the ramp from the starting frequency to the ending frequency. In other examples, however, the return to the starting frequency can be immediate (e.g., no ramp). In any case, the FMCW linear signal can include a repeating linear ramp from a starting frequency to an ending frequency. The more linear the modulation, the better the signal to noise ratio and the better the range resolution. If the modulation has non-linear errors radar sensitivity decreases due to spectral spreading in the receiver and resolution degrades. As known, this repeating FMCW linear ramp signal can be used in a radar for determining a distance to an object off of which the FMCW linear ramp signal reflects.

The FMCW signal is generated using a voltage controller oscillator (VCO) 122 and a transmit amplifier 124. The VCO 122 is controlled by a phase-locked loop (PLL). The PLL includes a fractional-n synthesizer 126 to control the VCO 122. The fractional-n synthesizer comprises an integrated circuit (IC) chip that meets or exceeds all performance minimums listed herein. Additionally, some performance minimums are required of other components of the PLL as indicated herein. The performance minimums include that the fractional-n synthesizer 126 have a phase detector frequency of at least 100 MHz. Accordingly, during operation the phase detector frequency of the fractional-n synthesizer 126 is set to 100 MHz or greater. In an example, the phase detector frequency of the synthesizer is set to 160 MHz. The performance minimums also include that the master clock 131 has a phase noise equal to or better than −150 dBc/Hz at 100 kHz offset. The PLL should use the lowest possible ratio for frequency division up to a phase detector frequency of 160 MHz. Phase noise increases at the rate of 20 Log(Divide Ratio). For example, if the reference frequency is 160 MHz, that corresponds to a division ratio of 4300 MHz/160 MHz=26.875. The phase noise that starts at the master oscillator at −150 dBc/Hz is degraded by 20 log(26.875)=28.59 dB. The phase noise rises from −150 dBc/Hz to −150+28.59=121.41 dBc/Hz. If the reference frequency is reduced to 100 MHz, then the divide ratio is 4300/100=43. 20 log(43)=32.66 dB, which means the master oscillator −150 dBc/Hz+32.66=117 dBc/Hz. In any case, the performance minimums included that the frequency division is 43 and the lowest reference frequency is 100 MHz.

The performance minimums include that a frequency step size applied by the fractional-n synthesizer 126 is sufficiently small, on the order to 100 Khz, to not cause spectral sidebands in the Fourier Transform used to derive the altitude range bins. The PLL loop filter then provides smoothing of these frequency steps. Thus, the loop bandwidth of the PLL is on the order of less than 100 KHz, which is less than the frequency step size. In an example, the performance minimums include that the fractional-n synthesizer 126 provide means to synthesize the desired frequency sweep bandwidth of the transmit signal in response to commands issued by a processing device 132, (e.g., an FPGA/PLD). The fractional-n-synthesizer 126 is commanded by the processing device 132 to set the starting frequency, ending frequency, and step-size required to achieve the desired frequency sweep bandwidth in the desired modulation period and maintain the FMCW linear ramp signal within the desired range. An example fractional-n synthesizer 126 that meets the performance minimums is the dual mode fractional-n/integer-n synthesizer ADF4159 from Analog Devices.

In an example, the PLL can also include a separate amplifier 128 and a loop filter 130 to generate the tuning control signal for the VCO 122 from the output of the fractional-n synthesizer 126. In another example, the amplifier 128 and loop filter 130 are not used if the charge pump of the fractional-n synthesizer 126 can drive the VCO 122 directly and include loop filter components in conjunction with the charge pump output.

The fractional-n synthesizer 126 implements a FMCW linear signal (waveform) by scheduling a small fixed frequency step to be added to or subtracted from the starting frequency until the ending frequency is reached. The fractional-n synthesizer 126 does not use a phase accumulator as in direct digital synthesis (DDS) architectures. The ramp for the signal is implemented by performing linear steps.

In an example, the output of the transmit amplifier 124 is a linear frequency sweep of 200 MHz modulated bandwidth between 4200-4400 MHz. The output of the VCO 122 can be tuned at least 300 MHz centered about 4300 MHz.

The receive path 106 of the radar 100 includes the mixer 118 as previously mentioned. The receive path 106 also includes an amplifier 134, high pass filter 136, another amplifier 138, low pass filter 140, and an analog to digital converter 142 to process the received signal. In another example, a matching network is used to reduce the reflected power from the antenna 102 to go back towards the circulator 108 and be passed to the mixer 118. After being processed in the receive path 106, the received signal is provided to a processing device such as a digital signal processor (DSP). The frequency difference generated by the mixer 118 is provided to the HPF 136, which filters the received analog signal according to a 6 dB per octave slope of gain versus frequency before the received signal is passed to the band limiting low pass filter 140. The 6 dB per octave slope is used in examples when radar 100 is configured as a radar altimeter. In other examples, the radar 100 is configured as a target detection radar and uses a slope of 12 dB per octave. In yet other examples, the radar 100 is configured as a weather or precipitation radar and uses a 9 dB per octave slope. This high pass filter compensates directly for the propagation losses over the distance transmitted and reflective signal travel. After the filter, a signal reflected from a fixed size target appears to have the same amplitude at all ranges. Then the received signal is sent to the A/D 142. The digital output of the A/D 142 is sent to a DSP which processes the digital output as described below. In an example, the clock signal for the A/D 142 is derived from the master clock 131. In this way, the clock signal for the A/D 142 is of low phase noise with resulting low jitter to ensure that the signal to noise ratio at the input to the A/D 142 is not degraded by phase noise of the clock signal. The clock signal is also coherent with the radar synthesis system. By using the master clock 131 as the source of the A/D clock signal the A/D conversion process is performed coherently. The clock signal for the A/D 142 cannot be generated by any other independent means such as by a DSP clock system or a clock system of the processing device 132 (e.g., an FPGA/PLD). The processing device 132, however, may be used to divide the frequency of the master clock 131 to the value used to drive the A/D 142, but the processing device 132 must not use an external FPGA clock in any way to accomplish the frequency division.

Figure 2:
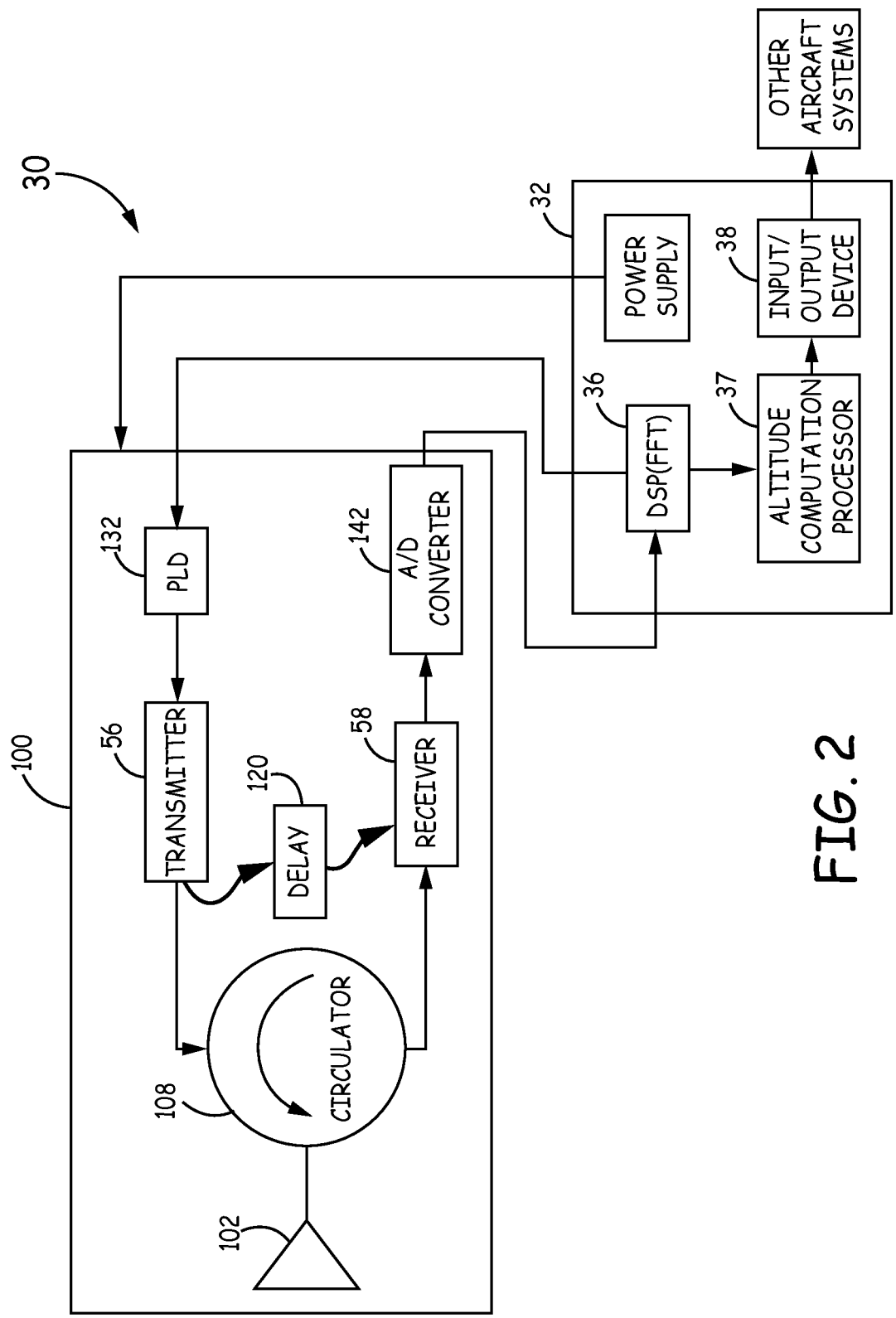
FIG. 2 is a block diagram of an example radar altimeter system including the FMCW radar of FIG. 1.

FIG. 2 is an example radar altimeter system 30 including the FMCW radar 100. The system 30 can provide accurate radar altimeter measurements and tail strike warnings. Along with the FMCW radar 100, the system 30 includes a signal processing system 32. The signal processing system 32 includes a processor 36, an altitude computation processor (ACP) 37 and an input/output device 38. In one embodiment, the processor 36 is a digital signal processor (DSP) or a field programmable gate array (FPGA) that is configured to perform Fast Fourier Transform (FFT). The FMCW radar 100 is in signal communication with the signal processing system 32 and other aircraft systems, such as a ground-proximity warning system. The FMCW radar 100 sends data received from the A/D 142 to the processor 36, which in turn transforms the data to altitude bin data and provides it to the ACP 37. The ACP 37 analyzes the altitude bin data to determine distance to ground values. The ACP 37 can generate a tail strike warnings based on the distance to ground values. If the ACP 37 produces a tail strike warning, the input/output device 38 presents a warning to the flight crew. The transmitter 56 shown in FIG. 2 includes components of the transmit path 104 such as the VCO 122, transmit amplifier 124, coupler 125, and the fractional-n synthesizer 126. The receiver 58 of FIG. 2 includes components of the receive path such as the amplifier 134, high pass filter 136, amplifier 138, and low pass filter 140. As discussed above, the FMCW radar 100 also includes a delay match path with a delay element 120 to cancel out most or all phase noise contained within a reflected signal 110 and the leakage signal 115 in the receiver mixer 118 before the desired delayed target reflection signals are processed by the receiver 58.

The DSP 36 can send a control signal to the processing device 132 which converts the control signal from the DSP 36 into commands for the fractional-n synthesizer 126 that translate into a linear frequency modulation of a particular bandwidth and period for the FMCW signal. The DSP 36 can also send control signals for calibration or self-test of the radar 100. For the received signals, the DSP 36 receives the digital output of sampled data from the A/D 142. The DSP 36 computes Fast Fourier Transforms (FFT) of the sampled data. The resulting frequency bins of the FFT correspond to incremental altitude bins. The ACP 37 uses algorithms to evaluate the altitude frequency bins to determine the aircraft height above the ground. Those algorithms may also determine if the potential exists for a tail strike during take off and report that information via the Input/Output Device 38 to other aircraft systems such as the flight controls.

Figure 3:
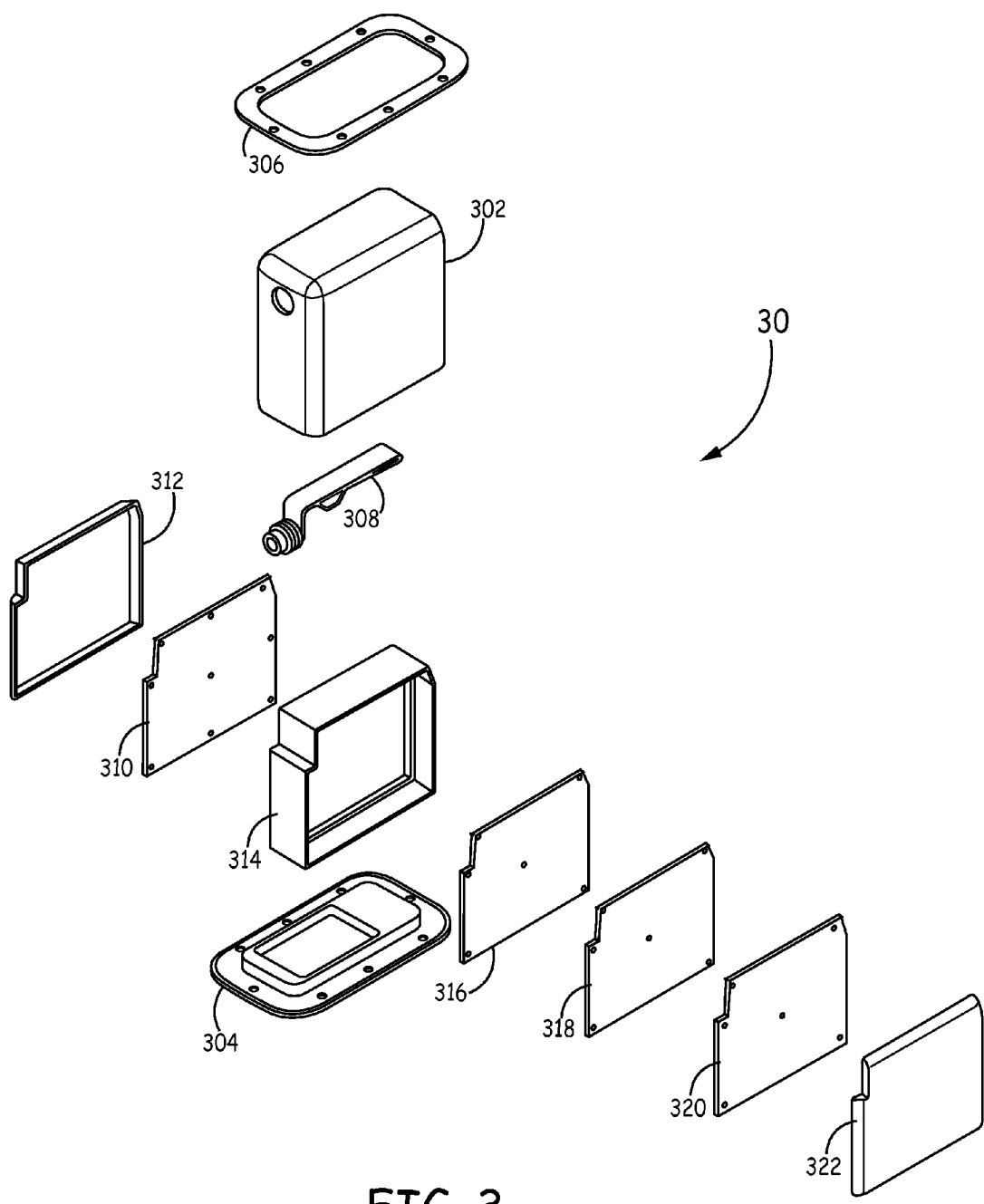
FIG. 3 is an exploded view of an example radar altimeter system.
Figure 4:
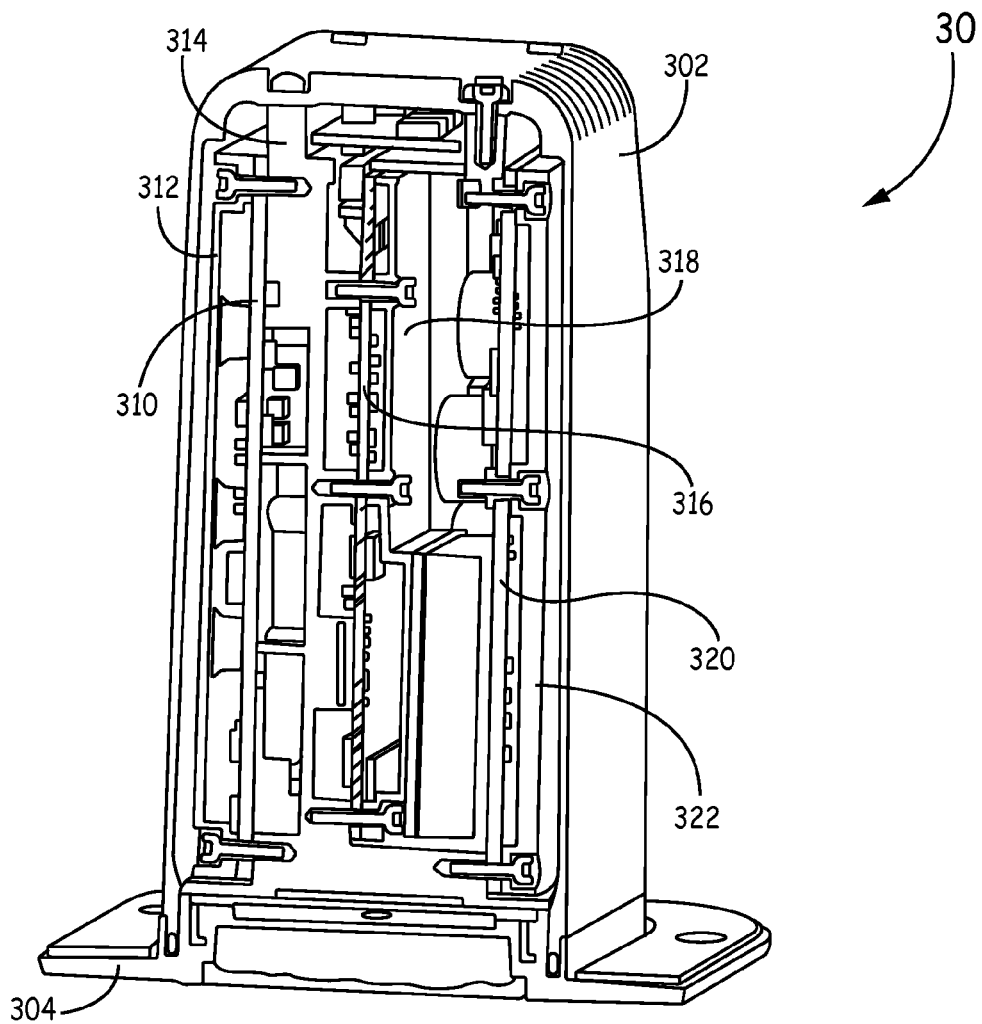
FIG. 4 is a cut-away view of the radar altimeter system of FIG. 3.

FIGS. 3 and 4 illustrate an example physical implementation of the radar altimeter system 30. FIG. 3 is an exploded view of the radar altimeter system 30. As shown the system 30 includes an outer housing 302 that can protect the electronics from the external environment. The outer housing 302 mounts to an antenna cover 304 which includes the antenna 102. The antenna cover 304 can be configured to mount to the outside of the aircraft skin. An input/output interconnect 308 is configured to fit primarily within the outer housing 302 and extend through an aperture in the outer housing 302 to enable interconnect with external systems. The connector 308 contains only power supply, and digital and analog signals used to control and monitor performance of the altimeter.

The electrical components of the radar altimeter system 30 are contained within the outer housing 302 and are mounted on three adjacent circuit boards. An RF circuit board 310 includes the analog and digital RF components of the transmitter and receiver. The RF circuit board 310 is coupled to the antenna 102 via a blind mate connector for transmission and reception of signals. A first cover 312 provides isolation for the analog and digital (e.g., the fractional-N-synthesizer) RF components on the RF circuit board 310. The RF circuit board 310 is mounted to a first side of a structural backbone 314 which is mounted to the antenna cover 304 and provides support and further isolation for the RF circuit board 310. The RF circuit board 310 includes components such as the fractional-n synthesizer 126, the transmit amplifier 124, the processing device 132, the master clock 131, and the A/D 142.

Mounted to the opposite side of the structural backbone 314 from the RF circuit board 310 is a digital circuit board 316. The digital circuit board 316 includes digital components such as the DSP, Memory and Input/Output Devices. The digital circuit board 316 is isolated by the structural backbone 314 and a second cover 318. On the opposite side of the second cover 318 from the digital circuit board 316 is a power supply board 320. The power supply board 320 is isolated by the second cover 318 and a third cover 322. Each of the third cover 322, power supply board 320, second cover 318, and digital circuit board 316 are a planar structure. The planar structures are disposed parallel and adjacent to one another and mounted to a second side of the structural backbone 314 such that the sides of each planar structure are facing the sides of the neighboring planar structure. Similarly, the RF circuit board 310 and the first cover 312 are also planar structures that are disposed parallel and adjacent to one another and mounted to the first side of the structure backbone 314 such that a side of the first cover 312 is facing a side of the RF circuit board 310.

FIG. 4 is a cut-away view of the radar altimeter system 30. As shown, the outer housing 302 is mounted to the antenna cover 304 which together enclose the electronic components. Inside the outer housing 302, the structural backbone 314 is mounted to the antenna cover 304 and to a portion of the outer housing 302. The first cover 312 and RF circuit board 310 are mounted to a first side of the structural backbone 314. The third cover 322, power supply circuit board 320, second cover 318, and digital circuit board 316 are mounted to a second and opposite side of the structural backbone 314. The assembled radar altimeter system 30 is configured to mount to another member via the antenna cover 304 attaching to the other member.

Advantageously, the physical design described with respect to FIGS. 3 and 4 is important to achieving the desired performance because it enables a short connection distance between the circulator 108 and the antenna 102. While it may be possible to implement a printed antenna on one side of a printed circuit board and the transmitter and receiver circuitry on the back side of a circuit board to provide intimate integration and minimal distance between the circulator and the antenna, this configuration does not allow the unit to be easily packaged for pressure differential (outside to inside an aircraft which can be 30,000 ft. or more) and moisture protection.

Additionally, the shape of the package enables the radar altimeter system 30 to fit within a re-enforcement structure (stringers and frames) of the fuselage. Specifically, newer class aircraft use stringers that are narrowly spaced. The package of the altimeter is designed to avoid cutting away any stringer or frames to allow installation. This reduces the cost of integration of the radar altimeter system 30 and achieves a large weight saving by eliminating the need to add "sister" structure stringers and frames that would otherwise have been cut away to make room for the altimeter environmental cover and connector. Thus, the aspect ratio and the height of the package have been set such that the radar altimeter system 30 will fit on a large number of aircraft fuselages with little impact to the fuselage structure.

EXAMPLE EMBODIMENTS

Example 1 includes a frequency modulated continuous wave (FMCW) radar comprising: a single antenna; a transmit path coupled to the single antenna and configured to provide a FMCW signal thereto, the transmit path including a voltage controlled oscillator controlled by a phase-locked loop, the phase-locked loop including a fractional-n synthesizer integrated circuit (IC) configured to implement a FMCW ramp waveform that ramps from a starting frequency to an ending frequency and upon reaching the ending frequency returns to the starting frequency to ramp again; a receive path coupled to the single antenna and configured to include a reflected version of the FMCW signal as a reflected signal and a portion of the FMCW signal leaking through a circulator as a leakage signal, the receive path including components configured to filter and sample a signal in the receive path; and a delay path coupled between a coupler on the transmit path and a mixer in the receive path, the delay path including a delay element configured to delay a local oscillator reference signal from the transmit path such that the propagation time of the local oscillator reference signal from the coupler to the mixer through the delay path is between the propagation time of the reflected signal and the propagation time of the leakage signal, wherein the mixer is configured to subtract the local oscillator reference signal from the signal in the receive path.

Example 2 includes the FMCW radar of Example 1, wherein the antenna has a substantially flat group delay over the entire swept bandwidth of the FMCW signal.

Example 3 includes the FMCW radar of any of Examples 1 or 2, wherein the circulator provides at least 20 dB of isolation from signals in the transmit path to the receive path.

Example 4 includes the FMCW radar of any of Examples 1-3, wherein the antenna has a voltage standing wave ratio of less than 1.2 to 1 and a return loss of greater than 20 dB.

Example 5 includes the FMCW radar of any of Examples 1-4, wherein the transmit path also includes an amplifier coupled to the output of the voltage controlled oscillator to amplify a transmitted signal in the transmit path, wherein the amplifier is controlled such that the transmitted signal is less than 23 dBm.

Example 6 includes the FMCW radar of any of Examples 1-5, wherein the fractional-n-synthesizer IC has a phase detector frequency of at least 100 MHz.

Example 7 includes the FMCW radar of Example 6, wherein a phase detector frequency of the fractional-n-synthesizer IC is set to 160 MHz.

Example 8 includes the FMCW radar of any of Examples 1-7, comprising a master clock coupled to the fractional-n-synthesizer to provide a clock signal for the fractional-n-synthesizer, wherein the master clock has a phase noise equal to or better than −150 dBc/Hz at 100 kHz offset.

Example 9 includes the FMCW radar of any of Examples 1-8, wherein a return from the ending frequency to the starting frequency is also a ramp.

Example 10 includes the FMCW radar of any of Examples 1-9, wherein the ramp from the starting frequency to the ending frequency is linear.

Example 11 includes the FMCW radar of Example 10, wherein the fractional-n-synthesizer is configured to implement the FMCW linear ramp signal by scheduling frequency steps to be added to or subtracted from the starting frequency until the ending frequency is reached.

Example 12 includes the FMCW radar of any of Examples 1-11, wherein a processing device is coupled to the fractional-n-synthesizer and configured to control operation of the fractional-n-synthesizer, wherein the fractional-n-synthesizer is configured to synthesize a frequency sweep bandwidth or a frequency deviation of the FMCW linear ramp signal based on a commanded frequency deviation or frequency sweep bandwidth to maintain the FMCW linear ramp signal within the desired range.

Example 13 includes a method of transmitting a frequency modulated continuous wave (FMCW) signal, the method comprising: providing a plurality of fixed frequency steps to a voltage controlled oscillator using a fractional-n-synthesizer, wherein the plurality of fixed frequency steps are configured to implement a linear ramp in frequency from a starting frequency to an ending frequency and upon reaching the ending frequency returning to the starting frequency; amplifying an output of the voltage controlled oscillator such to create a transmit signal, wherein amplifying the output includes amplifying the output by less than 23 dBm; propagating the transmit signal from an antenna; sensing reflections of the transmit signal; sensing signals at the antenna, wherein a receive path signal includes signals sensed by the antenna, reflections of the transmit signal off of the antenna, and leakage of the transmit signal through a circulator; subtracting a portion of the transmit signal, referred to as a local oscillator reference signal, with the receive path signal to cancel out phase noise in the receive path signal from the reflections and leakage of the transmit signal; and analyzing the receive path signal to determine a distance to an object off of which the transmit signal has reflected.

Example 14 includes the method of Example 13, comprising: delaying the portion of the transmit signal that is subtracted from the receive path signal with the receive path signal for a set delay, such that the propagation time of the local oscillator reference signal from is between the propagation time of the reflection of the transmit signal and the leakage of the transmit signal.

Example 15 includes the method of Example 14, comprising: providing a clock signal to the fractional-n-synthesizer having phase noise equal to or better than −150 dBc/Hz at 100 kHz offset.

Example 16 includes a frequency modulated continuous wave (FMCW) radar altimeter system comprising: a single antenna; a transmit path coupled to the single antenna and configured to provide a FMCW signal thereto, the transmit path including a voltage controlled oscillator controlled by a phase-locked loop, the phase-locked loop including a fractional-n synthesizer integrated circuit (IC) configured to implement a FMCW ramp waveform that ramps from a starting frequency to an ending frequency and upon reaching the ending frequency returns to the starting frequency to ramp again; a receive path coupled to the single antenna and configured to receive a reflected version of the FMCW signal, the receive path including components configured to filter and sample a signal in the receive path; a delay path coupled between a coupler on the transmit path and a mixer in the receive path, the delay path including a delay element configured to delay a local oscillator reference signal from the transmit path such that the propagation time of the local oscillator reference signal from the coupler to the mixer through the delay path is the same as the propagation time of a reflected signal from the coupler off of the single antenna and to the mixer, wherein the mixer is configured to provide cancellations of an undesired leakage and antenna reflected signal from a desired signal in the receive path; a first processor coupled to the receive path and configured to process samples of the signal in the receive path and produce altitude bin data therefrom, wherein the first processor is coupled to the transmit path and provides a control signal to the transmit path to implement the FMCW ramp waveform; an altitude computation processor coupled to the first processor and configured to process the altitude bin data to determine distance to ground values; and an output device to provide indications to a pilot based on the distance to ground values.

Example 17 includes the FMCW radar altimeter system of Example 16, wherein the antenna has a substantially flat group delay across the entire modulation bandwidth and a voltage standing wave ratio of less than 1.2 to 1 and a return loss of greater than 20 dB.

Example 18 includes the FMCW radar altimeter system of any of Examples 16 or 17, wherein the transmit path also includes an amplifier coupled to the output of the voltage controlled oscillator to amplify a transmitted signal in the transmit path, wherein the amplifier is controlled such that the transmitted signal is less than 23 dBm.

Example 19 includes the FMCW radar altimeter system of any of Examples 16-18, comprising a master clock coupled to the fractional-n-synthesizer to provide a clock signal for the fractional-n-synthesizer, wherein the master clock has a phase noise equal to or better than −150 dBc/Hz at 100 kHz offset, and wherein the fractional-n-synthesizer IC has a phase detector frequency of at least 100 MHz.

Example 20 includes the FMCW radar altimeter system of Examples 16-19, wherein a return from the ending frequency to the starting frequency is also a ramp, and wherein the ramp from the starting frequency to the ending frequency is linear; wherein the fractional-n-synthesizer is configured to implement the FMCW linear ramp signal by scheduling fixed frequency steps to be added to or subtracted from the starting frequency until the ending frequency is reached.

What is claimed is:

1. A frequency modulated continuous wave (FMCW) radar comprising:
    a single antenna;
    a transmit path coupled to the single antenna and configured to provide a FMCW signal thereto, the transmit path including a voltage controlled oscillator controlled by a phase-locked loop, the phase-locked loop including a fractional-n synthesizer integrated circuit (IC) configured to implement a FMCW ramp waveform that ramps from a starting frequency to an ending frequency and upon reaching the ending frequency returns to the starting frequency to ramp again;
    a receive path coupled to the single antenna and configured to include a reflected version of the FMCW signal as a reflected signal and a portion of the FMCW signal leaking through a circulator as a leakage signal, the receive path including components configured to filter and sample a signal in the receive path; and
    a delay path coupled between a coupler on the transmit path and a mixer in the receive path, the delay path including a delay element configured to delay a local oscillator reference signal from the transmit path such that the propagation time of the local oscillator reference signal from the coupler to the mixer through the delay path is between the propagation time of the reflected signal and the propagation time of the leakage signal, wherein the mixer is configured to subtract the local oscillator reference signal from the signal in the receive path.

2. The FMCW radar of claim 1, wherein the antenna has a substantially flat group delay over the entire swept bandwidth of the FMCW signal.

3. The FMCW radar of claim 1, wherein the circulator provides at least 20 dB of isolation from signals in the transmit path to the receive path.

4. The FMCW radar of claim 1, wherein the antenna has a voltage standing wave ratio of less than 1.2 to 1 and a return loss of greater than 20 dB.

5. The FMCW radar of claim 1, wherein the transmit path also includes an amplifier coupled to the output of the voltage controlled oscillator to amplify a transmitted signal in the transmit path, wherein the amplifier is controlled such that the transmitted signal is less than 23 dBm.

6. The FMCW radar of claim 1, wherein the fractional-n-synthesizer IC has a phase detector frequency of at least 100 MHz.

7. The FMCW radar of claim 6, wherein a phase detector frequency of the fractional-n-synthesizer IC is set to 160 MHz.

8. The FMCW radar of claim 1, comprising a master clock coupled to the fractional-n-synthesizer to provide a clock signal for the fractional-n-synthesizer, wherein the master clock has a phase noise equal to or better than −150 dBc/Hz at 100 kHz offset.

9. The FMCW radar of claim 1, wherein a return from the ending frequency to the starting frequency is also a ramp.

10. The FMCW radar of claim 1, wherein the ramp from the starting frequency to the ending frequency is linear.

11. The FMCW radar of claim 10, wherein the fractional-n-synthesizer is configured to implement the FMCW linear ramp signal by scheduling frequency steps to be added to or subtracted from the starting frequency until the ending frequency is reached.

12. The FMCW radar of claim 1, wherein a processing device is coupled to the fractional-n-synthesizer and configured to control operation of the fractional-n-synthesizer, wherein the fractional-n-synthesizer is configured to synthesize a frequency sweep bandwidth or a frequency deviation of the FMCW linear ramp signal based on a commanded frequency deviation or frequency sweep bandwidth to maintain the FMCW linear ramp signal within the desired range.

13. A method of transmitting a frequency modulated continuous wave (FMCW) signal, the method comprising:
    providing a plurality of fixed frequency steps to a voltage controlled oscillator using a fractional-n-synthesizer, wherein the plurality of fixed frequency steps are configured to implement a linear ramp in frequency from a starting frequency to an ending frequency and upon reaching the ending frequency returning to the starting frequency;
    amplifying an output of the voltage controlled oscillator such to create a transmit signal, wherein amplifying the output includes amplifying the output by less than 23 dBm;
    propagating the transmit signal from an antenna;
    sensing reflections of the transmit signal;
    sensing signals at the antenna, wherein a receive path signal includes signals sensed by the antenna, reflections of the transmit signal off of the antenna, and leakage of the transmit signal through a circulator;
    subtracting a portion of the transmit signal, referred to as a local oscillator reference signal, with the receive path signal to cancel out phase noise in the receive path signal from the reflections and leakage of the transmit signal; and
    analyzing the receive path signal to determine a distance to an object off of which the transmit signal has reflected.

14. The method of claim 13, comprising:
    delaying the portion of the transmit signal that is subtracted from the receive path signal with the receive path signal for a set delay, such that the propagation time of the local oscillator reference signal from is between the propagation time of the reflection of the transmit signal and the leakage of the transmit signal.

15. The method of claim 14, comprising:
    providing a clock signal to the fractional-n-synthesizer having phase noise equal to or better than −150 dBc/Hz at 100 kHz offset.

16. A frequency modulated continuous wave (FMCW) radar altimeter system comprising:
    a single antenna;
    a transmit path coupled to the single antenna and configured to provide a FMCW signal thereto, the transmit path including a voltage controlled oscillator controlled by a phase-locked loop, the phase-locked loop including a fractional-n synthesizer integrated circuit (IC) configured to implement a FMCW ramp waveform that ramps from a starting frequency to an ending frequency and upon reaching the ending frequency returns to the starting frequency to ramp again;

a receive path coupled to the single antenna and configured to receive a reflected version of the FMCW signal, the receive path including components configured to filter and sample a signal in the receive path;

a delay path coupled between a coupler on the transmit path and a mixer in the receive path, the delay path including a delay element configured to delay a local oscillator reference signal from the transmit path such that the propagation time of the local oscillator reference signal from the coupler to the mixer through the delay path is the same as the propagation time of a reflected signal from the coupler off of the single antenna and to the mixer, wherein the mixer is configured to provide cancellations of an undesired leakage and antenna reflected signal from a desired signal in the receive path;

a first processor coupled to the receive path and configured to process samples of the signal in the receive path and produce altitude bin data therefrom, wherein the first processor is coupled to the transmit path and provides a control signal to the transmit path to implement the FMCW ramp waveform;

an altitude computation processor coupled to the first processor and configured to process the altitude bin data to determine distance to ground values; and an output device to provide indications to a pilot based on the distance to ground values.

17. The FMCW radar altimeter system of claim 16, wherein the antenna has a substantially flat group delay across the entire modulation bandwidth and a voltage standing wave ratio of less than 1.2 to 1 and a return loss of greater than 20 dB.

18. The FMCW radar altimeter system of claim 16, wherein the transmit path also includes an amplifier coupled to the output of the voltage controlled oscillator to amplify a transmitted signal in the transmit path, wherein the amplifier is controlled such that the transmitted signal is less than 23 dBm.

19. The FMCW radar altimeter system of claim 16, comprising a master clock coupled to the fractional-n-synthesizer to provide a clock signal for the fractional-n-synthesizer, wherein the master clock has a phase noise equal to or better than −150 dBc/Hz at 100 kHz offset, and wherein the fractional-n-synthesizer IC has a phase detector frequency of at least 100 MHz.

20. The FMCW radar altimeter system of claim 16, wherein a return from the ending frequency to the starting frequency is also a ramp, and wherein the ramp from the starting frequency to the ending frequency is linear;

wherein the fractional-n-synthesizer is configured to implement the FMCW linear ramp signal by scheduling fixed frequency steps to be added to or subtracted from the starting frequency until the ending frequency is reached.

* * * * *